(12) United States Patent
Edwards et al.

(10) Patent No.: US 10,192,863 B2
(45) Date of Patent: Jan. 29, 2019

(54) SERIES CONNECTED ESD PROTECTION CIRCUIT

(71) Applicant: Texas Instruments Incorporated, Dallas, TX (US)

(72) Inventors: Henry L. Edwards, Garland, TX (US); Akram A. Salman, Plano, TX (US); Md Iqbal Mahmud, Hillsboro, OR (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 14/221,432

(22) Filed: Mar. 21, 2014

(65) Prior Publication Data

US 2015/0270257 A1 Sep. 24, 2015

(51) Int. Cl.
*H01L 27/02* (2006.01)
*H01L 29/06* (2006.01)

(52) U.S. Cl.
CPC ...... *H01L 27/0262* (2013.01); *H01L 27/0259* (2013.01); *H01L 29/0649* (2013.01)

(58) Field of Classification Search
CPC ............. H01L 27/0262; H01L 27/0237; H01L 27/0259; H01L 27/0292
See application file for complete search history.

(56) References Cited

U.S. PATENT DOCUMENTS

| | | | | |
|---|---|---|---|---|
| 6,395,593 B1* | 5/2002 | Pendharkar | ........... | H01L 21/761 257/E21.544 |
| 2005/0083618 A1* | 4/2005 | Steinhoff | ............ | H01L 27/0259 361/56 |
| 2012/0092798 A1* | 4/2012 | Hwang | ............... | H01L 27/0259 361/56 |
| 2013/0093017 A1* | 4/2013 | Ko | .................... | H01L 29/66659 257/343 |
| 2013/0279051 A1* | 10/2013 | Gill | ........................ | H02H 9/041 361/56 |
| 2015/0041890 A1* | 2/2015 | Campi, Jr. | .......... | H01L 29/7816 257/339 |

\* cited by examiner

*Primary Examiner* — Michael Lebentritt
*Assistant Examiner* — Suberr Chi
(74) *Attorney, Agent, or Firm* — Rose Alyssa Keagy; Charles A. Brill; Frank D. Cimino (57) ABSTRACT

An electrostatic discharge (ESD) protection circuit (FIG. 2A) for an integrated circuit is disclosed. The circuit is formed on a substrate (P-EPI) having a first conductivity type. A buried layer (NBL 240) having a second conductivity type is formed below a face of the substrate. A first terminal (206) and a second terminal (204) are formed at a face of the substrate. A first ESD protection device (232) has a first current path between the first terminal and the buried layer. A second ESD protection device (216) has a second current path in series with the first current path and between the second terminal and the buried layer.

16 Claims, 9 Drawing Sheets

SERIES CONNECTED ESD PROTECTION CIRCUIT

BACKGROUND OF THE INVENTION

Embodiments of the present embodiments relate to series-connected elements of an electrostatic discharge (ESD) protection circuit. Preferred embodiments of the circuit are intended for use at input, output, input-output, or power supply terminals of an integrated circuit.

Figure 1A:
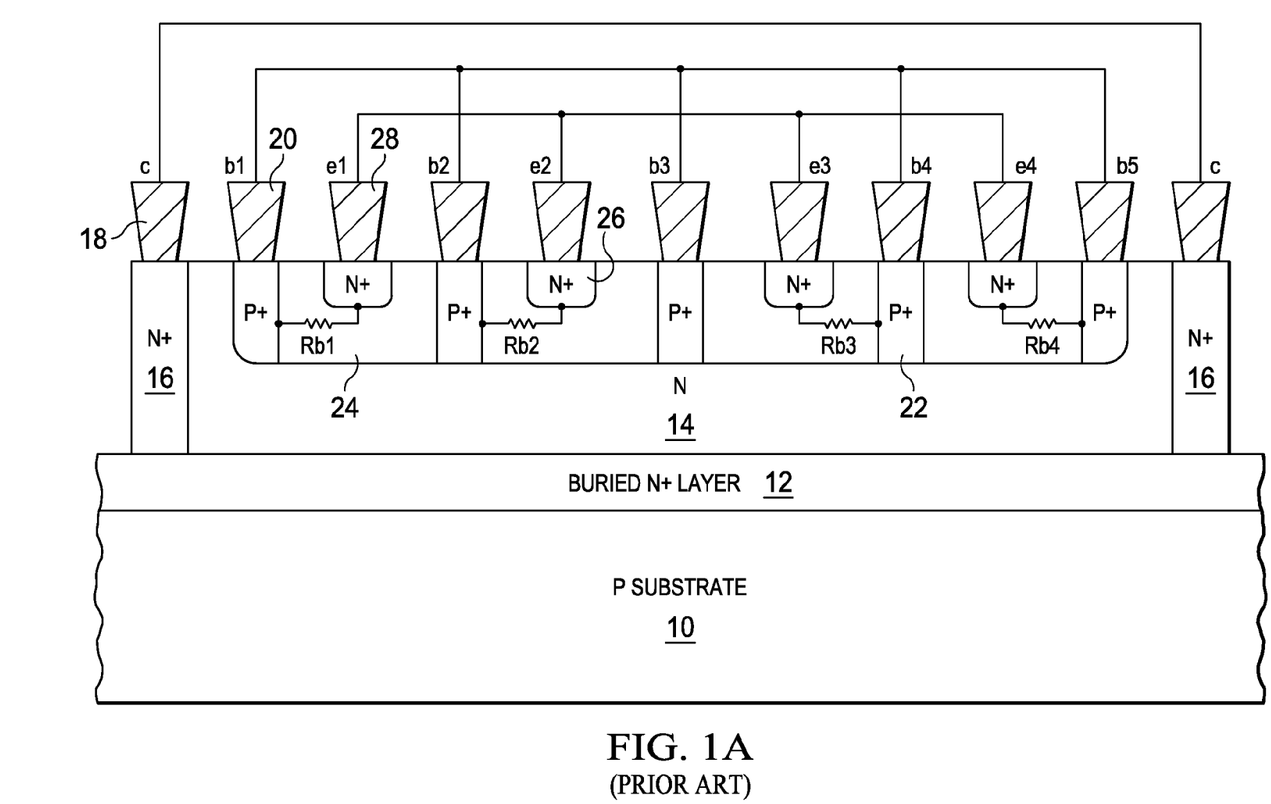
FIG. 1A is a circuit diagram of an electrostatic discharge (ESD) protection circuit of the prior art.

Referring to FIG. 1A, there is an ESD protection circuit of the prior art as disclosed by Yu in U.S. Pat. No. 6,472,286. The circuit of FIG. 1A is a cross section of a multi finger NPN bipolar transistor as described at col. 3, line 31 through col. 4, line 8. The circuit is fabricated on a P-type substrate 10 with a heavily doped N+ layer 12. An N-type layer 14 is formed over layer 12. A P-type base region 24 is formed at a surface of the substrate 10 and connected to P+ region 22. An N+ emitter region 26 is formed within base region 24. A deep N+ region 16 is connected to N+ layer 12 and serves as a collector surface contact. Surface contacts 18, 20, and 28 for respective collector, base, and emitter regions are formed over the surface of the substrate 10.

Figure 1B:
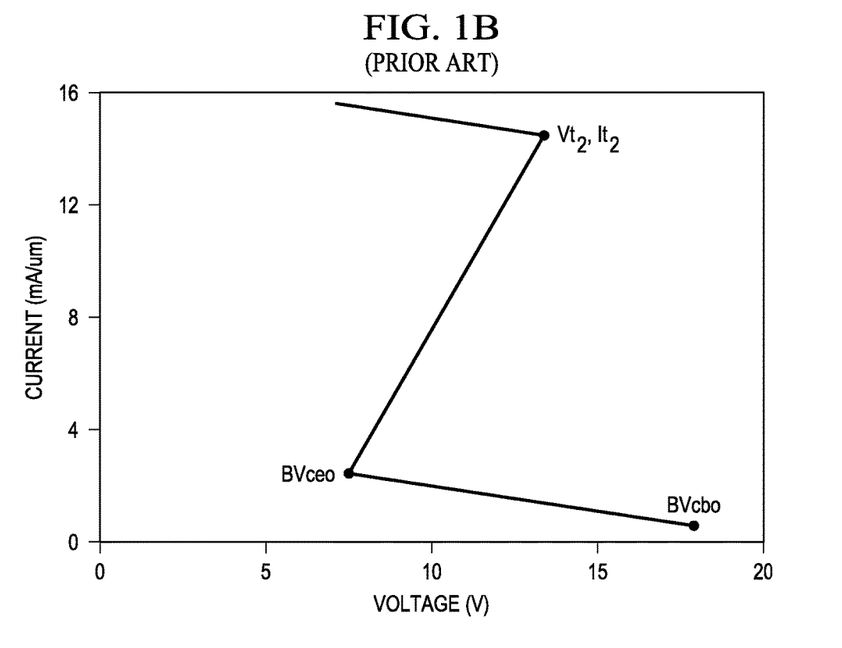
FIG. 1B is a current-voltage (IV) characteristic of a bipolar NPN ESD protection transistor as illustrated at FIG. 1A.

FIG. 1B discloses a typical current-voltage characteristic of a bipolar NPN transistor as illustrated at FIG. 1A (col. 1, lines 31-61). The waveform illustrates three points of interest for an increasing positive voltage applied to the NPN collector with respect to the NPN emitter. First is the initial collector-base breakdown voltage BVcbo, which may also be referred to as the collector-base avalanche threshold, first breakdown, or Vt1, It1. The second point is BVceo which may also be referred to as the snapback voltage. The third point is Vt2, It2, which is the transition point between NPN avalanche conduction and second breakdown.

There are several problems with the circuit of FIG. 1A and the associated current-voltage characteristic of FIG. 1B. First, BVcbo is approximately 18 V and may exceed the damage threshold (Vdam) of contemporary integrated circuits the ESD protection circuit is to protect. Second, BVceo is approximately 8 V and may be less than the operating voltage of the integrated circuit the ESD protection circuit is to protect, thereby causing electrical overstress (EOS) after an ESD event. Finally, the deep N+ collector contact region 16 of FIG. 1A must be spaced apart from P+ base contact region 22 to avoid avalanche conduction and to provide sufficient area for lateral diffusion in subsequent high temperature processing steps of the integrated circuit. Various embodiments of the present invention are directed to solving these and other problems and improving operation of the ESD protection circuit without increasing process complexity.

BRIEF SUMMARY OF THE INVENTION

In a preferred embodiment of the present invention, an electrostatic discharge (ESD) protection circuit for an integrated circuit is disclosed. The ESD protection circuit is formed on a substrate having a first conductivity type. A buried layer having a second conductivity type is formed below a face of the substrate. A first and a second terminal are formed at the face of the substrate. A first ESD protection device has a first current path between the first terminal and the buried layer. A second ESD protection device has a second current path in series with the first current path and between the second terminal and the buried layer.

DETAILED DESCRIPTION OF THE INVENTION

The preferred embodiments of the present invention provide significant advantages over electrostatic discharge (ESD) protection circuits of the prior art as will become evident from the following detailed description.

Figure 2A:
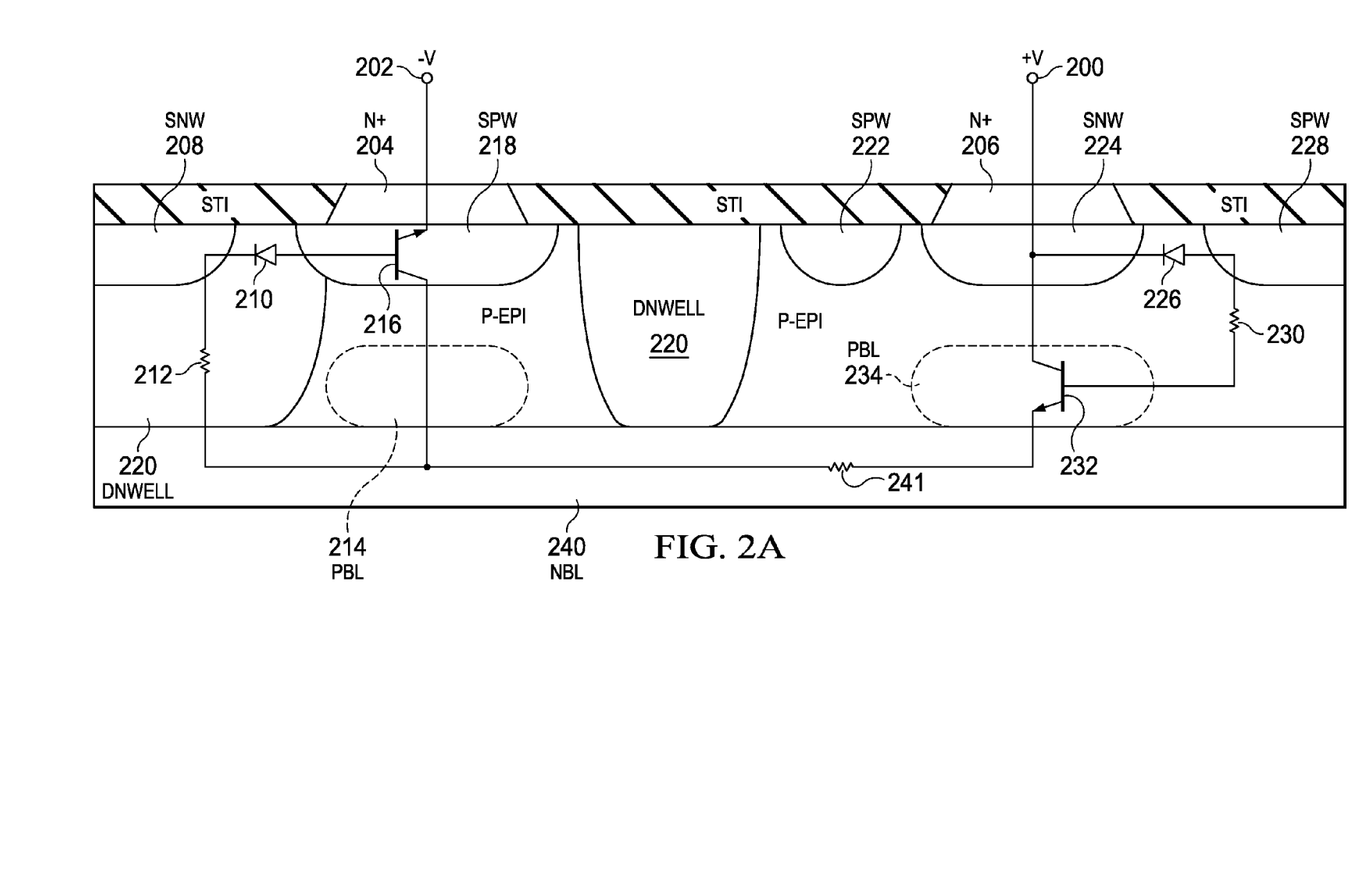
FIG. 2A is a cross sectional diagram of a first embodiment of an ESD protection circuit of the present invention.

Referring to FIG. 2A, there is a cross sectional diagram of a first embodiment of an ESD protection circuit of the present invention. FIG. 2C is a schematic diagram of the circuit of FIG. 2A and illustrates a circuit 242 protected by the ESD protection circuit. Protected circuit 242 may be a bipolar circuit or a circuit having bipolar, N-channel, and P-channel transistors in a bipolar and complementary metal oxide semiconductor (BiCMOS) integrated circuit. Here and in the following discussion, the same reference numerals are used to indicate substantially the same features. The protection circuit is formed on a P-type substrate (P-EPI) with an N-type buried layer (NBL) 240 formed below a surface of the substrate. NBL 240 is preferably a relatively low resistance buried layer. A first N+ region 206 is connected to terminal 200, which may be an input, output, input-output, or power supply terminal. In a preferred embodiment, the N+ region is separated from other active regions at the surface by shallow trench isolation regions (STI). However, active regions may also be separated by local oxidation of silicon (LOCOS) as is known in the art. N+ region 206 is electrically connected to shallow N-well (SNW) 224 and serves as a collector for NPN bipolar transistor 232. NPN transistor 232 includes the P-EPI layer as a base and NBL 240 as an emitter. Thus, NPN transistor 232 has a current path between N+ region 206 and NBL 240. Diode 226 is formed between SNW 224 and shallow P-well (SPW) 228 and has an avalanche threshold substantially determined by a space between SNW 224 and SPW 228. The avalanche threshold is advantageously designed to be less than the collector-base, open emitter breakdown voltage (BVcbo) of NPN transistor 232. Parasitic resistor 230 couples the anode of diode 228 to the base of NPN transistor 232. P-type buried layer 234 is optional as indicated by the dashed line and may be included to inhibit collector-emitter punch through of NPN transistor 232.

The protection circuit of FIG. 2A further includes a second N+ region 204 connected to terminal 202, which may be an input, output, input-output, or power supply terminal. Shallow P-well (SPW) 218 is formed under N+ region 204 and together with the P-EPI layer serves as a base for NPN bipolar transistor 216. Here and in the following embodiments of the present invention it should be understood that SPW 218 may be omitted when the P-EPI concentration is suitable. Furthermore, SPW 218 may also be replaced by shallow N-well (SNW) to make emitter 204 deeper, thereby suppressing current filament formation during an ESD event. The NPN transistor 216 includes N+ region 204 as an emitter and NBL 240 as a collector. Thus, NPN transistor 216 has a current path between N+ region 204 and NBL 240 that is in series with the current path of NPN transistor 232. Diode 210 is formed between SNW 208 and SPW 218 and has an avalanche threshold substantially determined by a space between SNW 208 and SPW 218. The avalanche threshold is advantageously designed to be less than BVcbo of NPN transistor 216. Parasitic resistor 212 couples the cathode of diode 210 to the collector of NPN transistor 216 through DNWELL 220. P-type buried layer 214 is optional as indicated by the dashed line and may be included to inhibit collector-emitter punch through of NPN transistor 216. Deep N-well (DNWELL) region 220 is formed between STI and NBL 240 to electrically isolate the base of NPN transistor 216 from the base of NPN transistor 232.

Operation of the ESD protection circuit of FIGS. 2A and 2C will now be described with reference to the transmission line pulse (TLP) wave forms of FIG. 2D. FIG. 2D shows measured TLP wave forms for both 100 ns and 500 ns pulse widths with a positive voltage corresponding to a positive voltage at terminal 200 with respect to terminal 202. During normal circuit operation NPN transistors 232 and 216 are both off, since they receive no base current. As voltage V+ becomes more positive and exceeds the avalanche threshold of diode 226, current flows through resistor 230 and into the base of NPN transistor 232. NPN transistor 216, however, is still off. Voltage V+ continues to increase until the voltage at terminal 240 exceeds the avalanche threshold of diode 210. This occurs when voltage V+ is about two base-emitter voltage drops plus the reverse bias avalanche threshold of diodes 226 and 210 with respect to voltage V− or about 37 V. NPN transistors 232 and 216 then enter snapback conduction and the TLP voltage decreases to about 36 V. As voltage V+ becomes increasingly positive, both the 100 ns and 500 ns TLP waveforms exhibit a positive slope corresponding to resistance of the series current paths and parasitic circuit resistance. The ESD protection circuit functions in a similar manner when TLP voltage V+ is negative with respect to voltage V− except that diodes 226 and 210 are both forward biased. Thus, conduction of NPN transistors 232 and 216 occurs at a much lower voltage.

The ESD protection circuit of FIG. 2A offers several significant advantages over circuits of the prior art. First, deep collector implants 16 (FIG. 1A) as disclosed by Yu are unnecessary. The current path between terminals 200 and 202 is completed by series-connected NPN transistors 232 and 216 via intermediate NBL 240. This eliminates the need for the deep collector implant process step and significantly reduces required area for the ESD protection circuit, since other semiconductor regions are not spaced apart from the deep collector implant and no corresponding allowance for lateral diffusion is necessary. Second, the finite resistance 241 of NBL 240 suppresses current filament formation and prevents local thermal runaway during an ESD event. Third, diodes 226 and 210 set the trigger voltage for the ESD protection circuit slightly above the snapback voltage of series-connected NPN transistors 232 and 216. This advantageously assures that the maximum V+ voltage during an ESD event will not exceed the damage threshold (Vdam) of protected circuit 242. The avalanche threshold of diode 226 is set by the space between SNW 224 and SPW 228. Likewise, the avalanche threshold of diode 210 is set by the space between SNW 208 and SPW 218. Fourth, the respective snapback voltages of NPN transistors 232 and 216 are additive, so the snapback or holding voltage of the ESD protection circuit is greater than the operating voltage of protected circuit 242. This assures that an ESD event during normal circuit operation will not induce electrical overstress (EOS) due to a high level of power supply current after the ESD event. Finally, spacing between SNW 208 and SPW 218 and between SNW 224 and SPW 228 may advantageously be adjusted to independently set the avalanche thresholds of respective diodes 210 and 226.

Figure 2B:
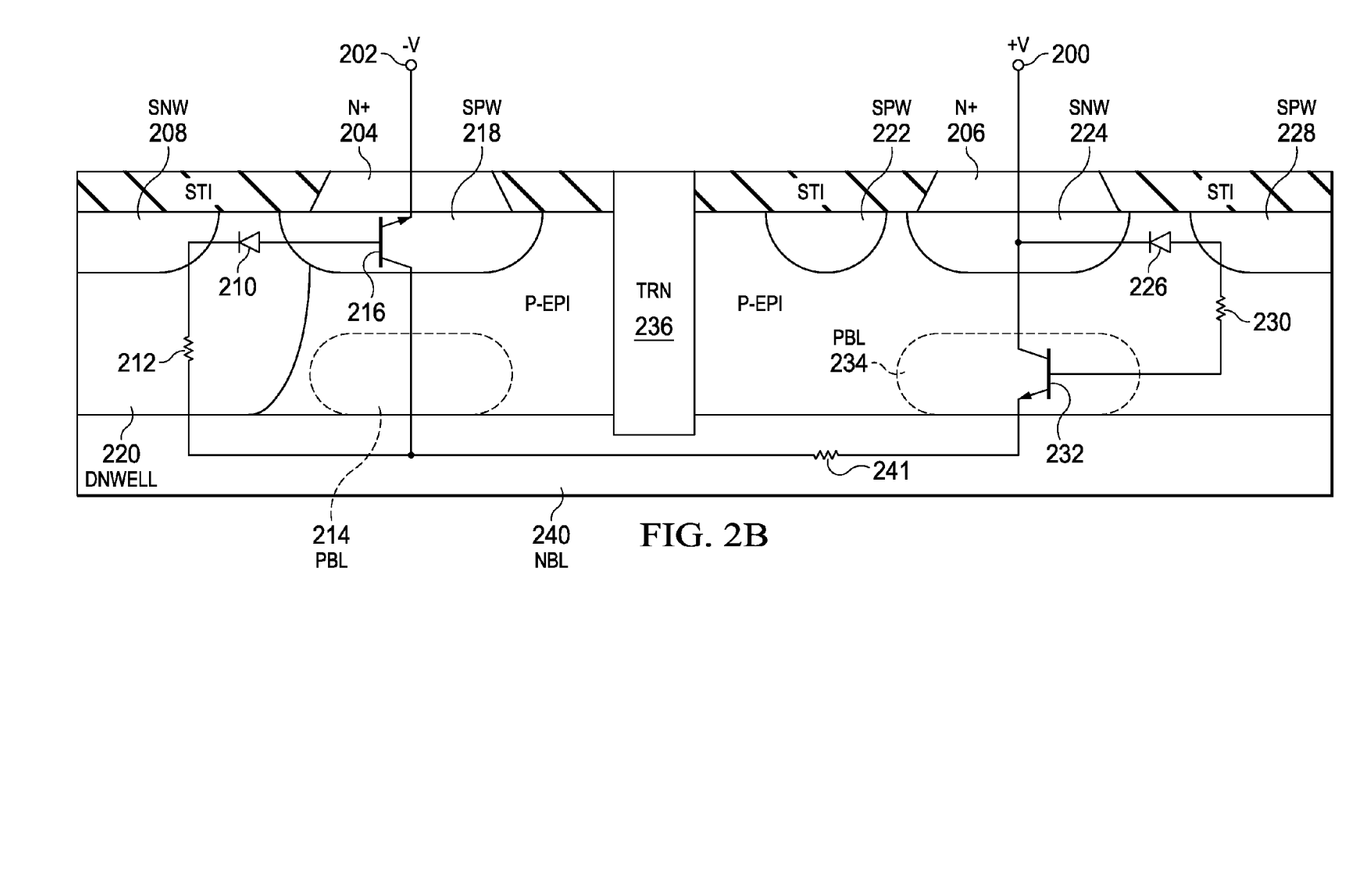
FIG. 2B is a cross sectional diagram of a second embodiment of an ESD protection circuit of the present invention.
Figure 2C:
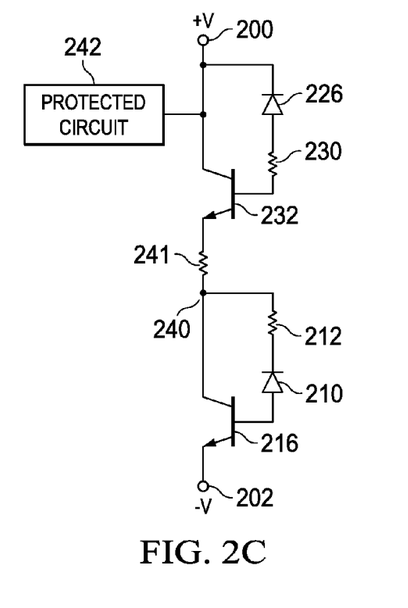
FIG. 2C is a schematic diagram of the ESD protection circuit of FIG. 2A.
Figure 2D:
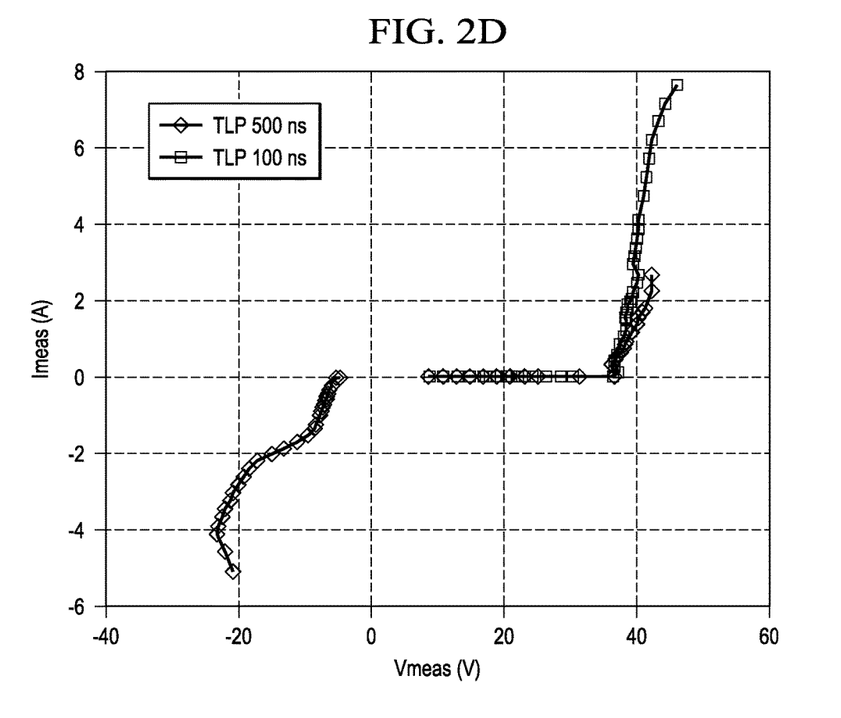
FIG. 2D is a transmission line pulse (TLP) wave form of the ESD protection circuit of FIG. 2A.

Referring now to FIG. 2B, there is a cross sectional diagram of a second embodiment of an ESD protection circuit of the present invention. This embodiment functions as previously described with regards to FIG. 2A. Base isolation region DNWELL 220, however, is replaced by deep trench 236, which preferably extends from the surface of the P-EPI substrate to NBL 240. This embodiment isolates the base regions of NPN transistors 232 and 216 from each other and advantageously requires less area than the embodiment of FIG. 2A.

Figure 3:
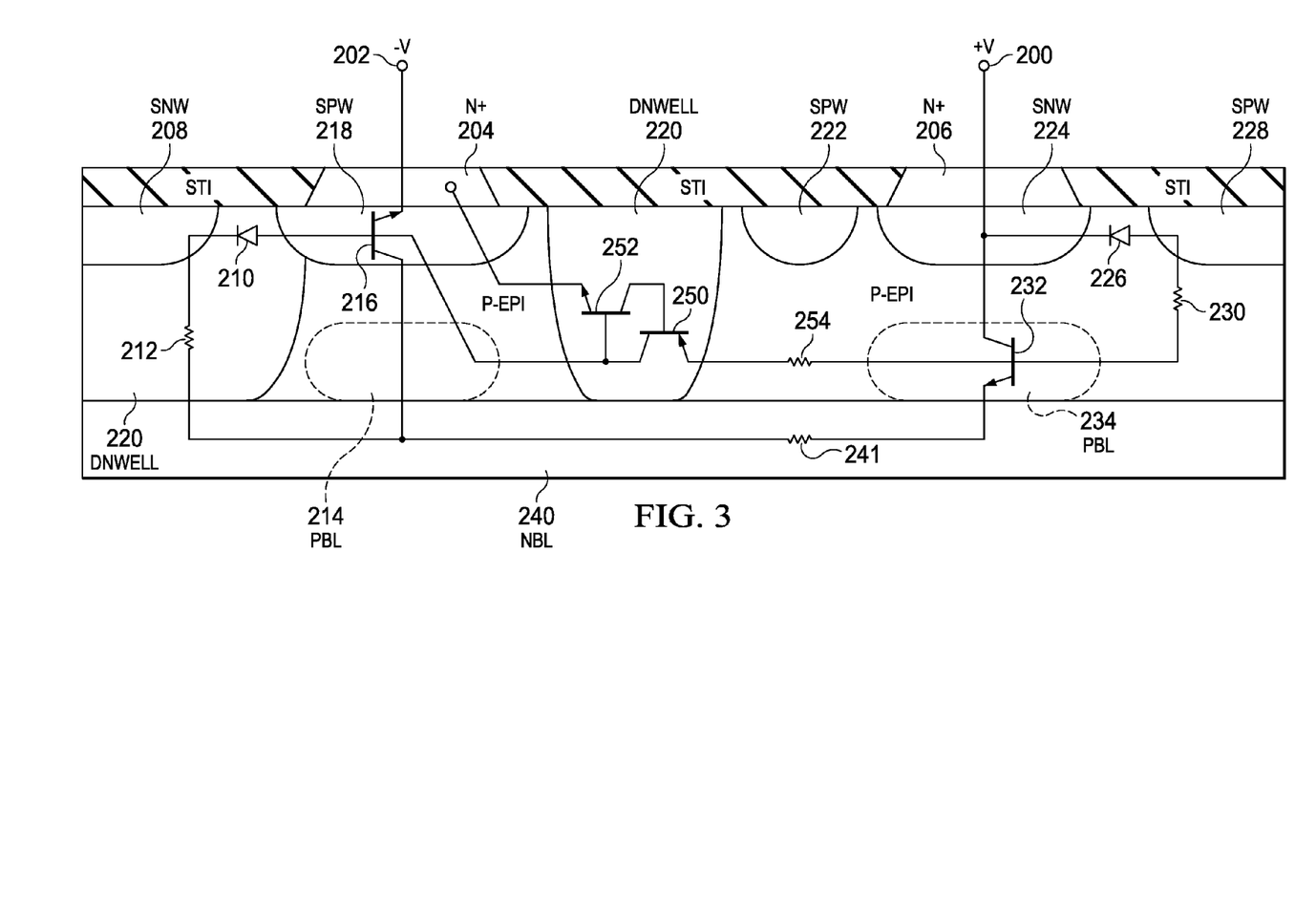
FIG. 3 is a cross sectional diagram of the ESD protection circuit of FIG. 2A showing a parasitic semiconductor controlled rectifier (SCR)

Turning now to FIG. 3, there is a cross sectional diagram of the ESD protection circuit of FIG. 2A showing a parasitic semiconductor controlled rectifier (SCR). The SCR is a parasitic PNPN structure formed by the P-type base of NPN transistor 232, DNWELL 220, the P-type base of NPN transistor 216, and N+ region 204, respectively. Parasitic resistor 254 represents lateral resistance of the P-EPI layer and is designed to develop a voltage drop that is greater than the snapback or holding voltage of the ESD protection circuit. Moreover, the linear junctions formed by the P-EPI layer and DNWELL provide an SCR trigger voltage that is greater than the trigger voltage of the ESD protection circuit as determined by diodes 226 and 210. More specifically, the linear junctions form a PNP transistor 250 and an NPN transistor 252. In this configuration, the collector of the NPN transistor 252 is coupled to the base of the PNP transistor 250, and the emitter of the PNP transistor 250 is coupled to the base of the NPN transistor 252. The embodiment of FIG. 2B may also be used to eliminate the parasitic SCR.

Figure 4A:
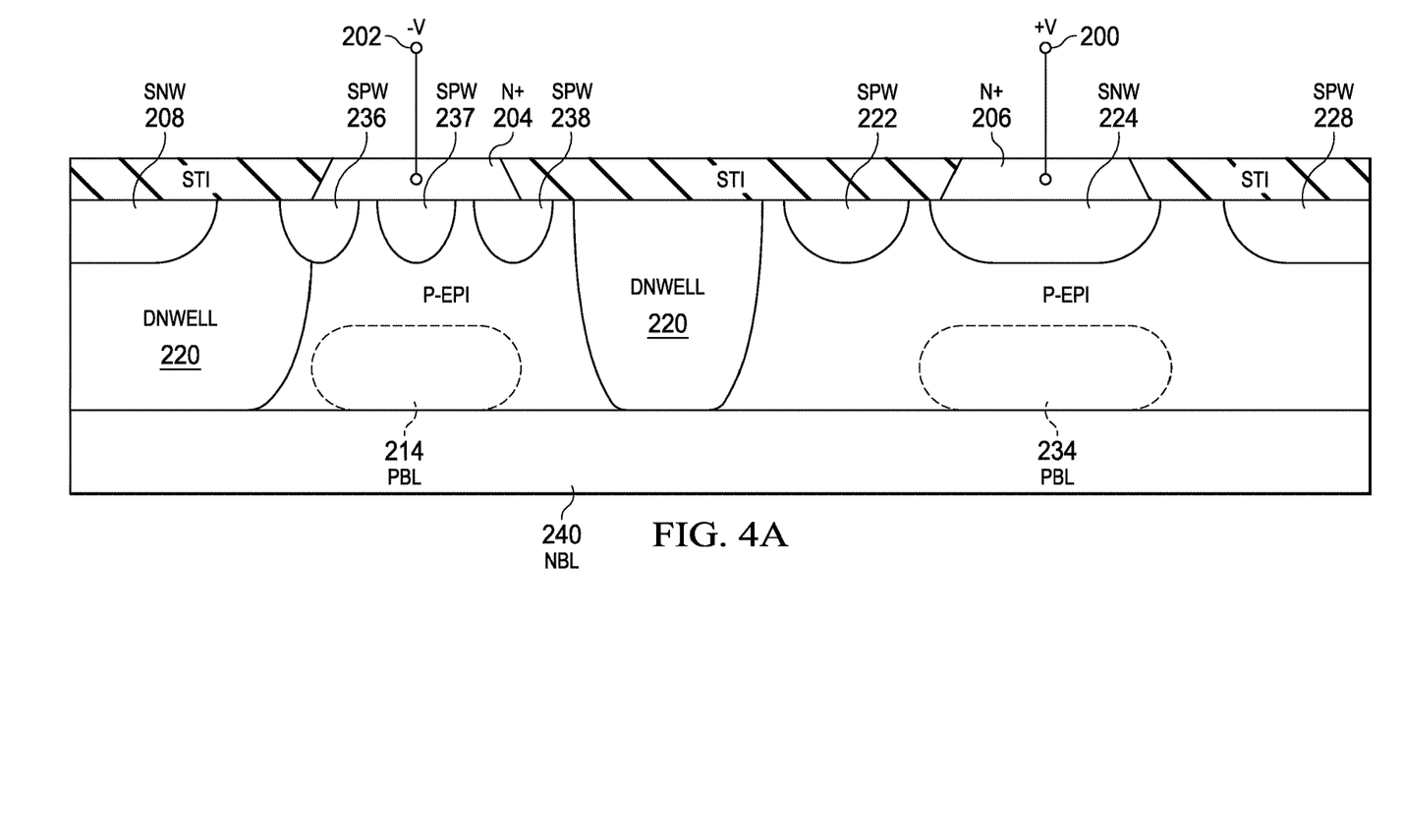
FIGS. 4A and 4B are respective cross sectional and schematic diagrams of a third embodiment of an ESD protection circuit of the present invention.
Figure 4B:
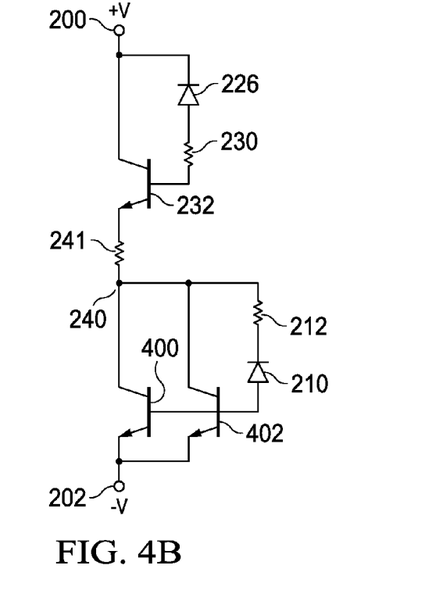

Referring next to FIGS. 4A and 4B, there are respective cross sectional and schematic diagrams of a third embodiment of an ESD protection circuit of the present invention. This embodiment is the same as the embodiment of FIG. 2A except that SPW 218 (FIG. 2A) is replaced by segmented SPW 236-238. The segmented SPW substitutes parallel NPN transistors 400 and 402 for NPN transistor 216 (FIG. 2A). NPN transistor 400 is similar to NPN transistor 216 and includes SPW 236-238 in the base region. The base-emitter junction of NPN transistor 402, however, is directly between the P-EPI layer and N+ emitter region 204. Thus, NPN transistor 400 has a first base doping profile, and NPN transistor 402 has a second base doping profile that is different from the first base doping profile. NPN transistor 402, therefore, has a relatively higher gain than NPN transistor 400. The effect of these parallel NPN transistors 400 and 402 is to reduce the snapback or holding voltage of the ESD protection circuit and provide a corresponding increase in failure threshold.

Figure 5A:
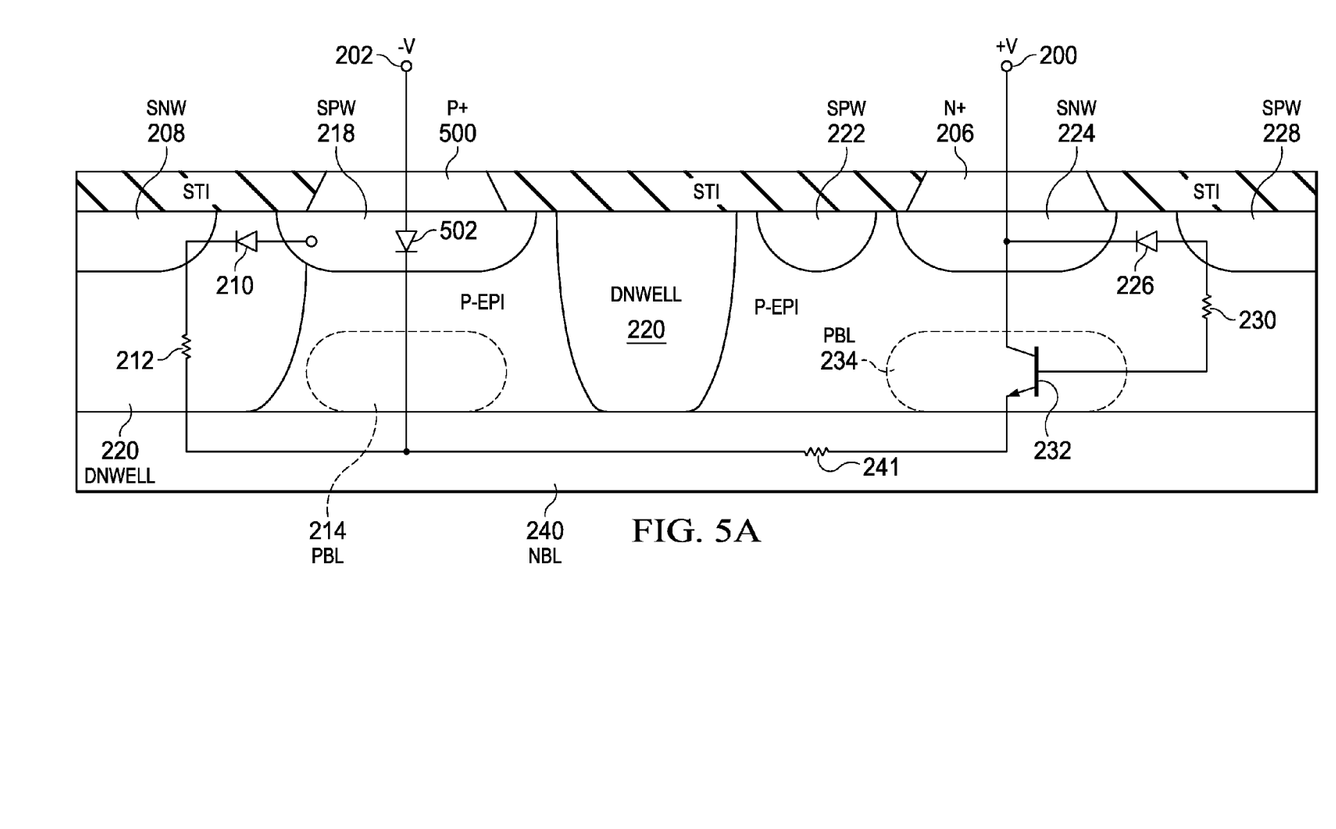
FIGS. 5A and 5B are respective cross sectional and schematic diagrams of a fourth embodiment of an ESD protection circuit of the present invention.
Figure 5B:
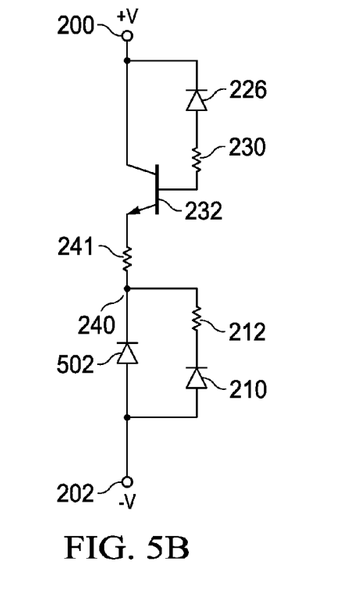

FIGS. 5A and 5B illustrate respective cross sectional and schematic diagrams of a fourth embodiment of an ESD protection circuit of the present invention. This embodiment is similar to the embodiment of FIG. 2A except that PN diode 502 replaces NPN transistor 216 and P+ anode 500 replaces N+ emitter 204. This embodiment of the present invention provides a holding voltage during an ESD event determined by the avalanche voltage of diode 502 plus the snapback voltage of NPN transistor 232. This may be desirable for integrated circuits having a higher operating voltage and damage threshold. Moreover, this embodiment of the present invention may also be used in combination with previously discussed circuit elements.

Figure 6A:
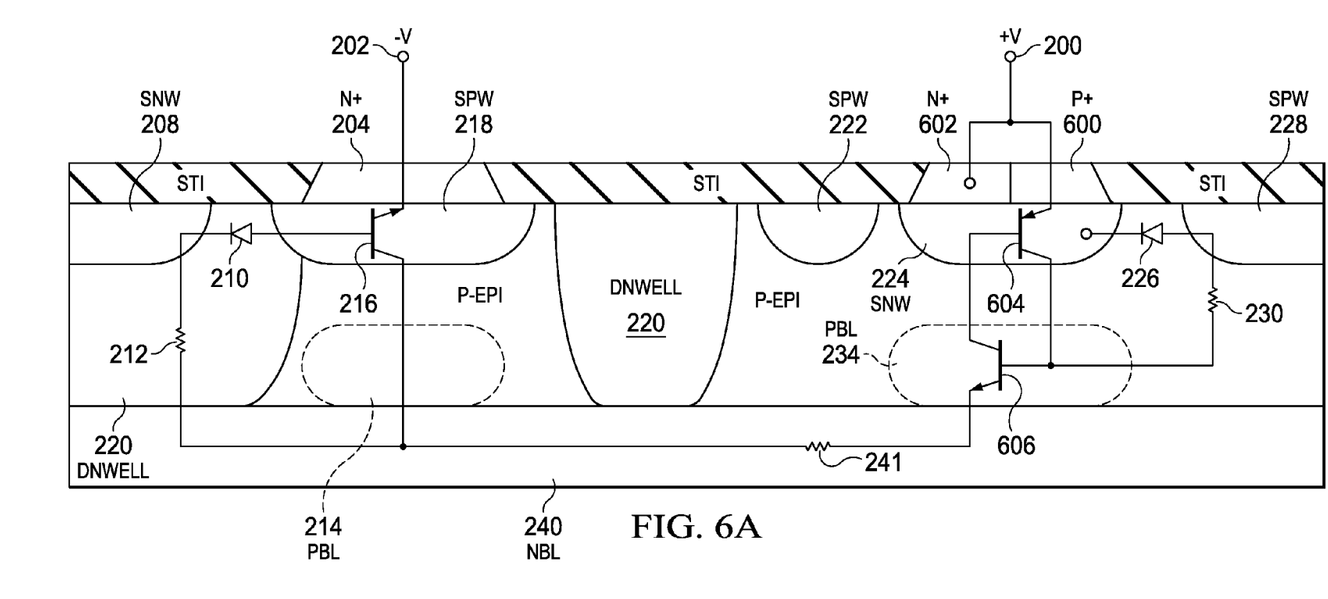
FIGS. 6A and 6B are respective cross sectional and schematic diagrams of a fifth embodiment of an ESD protection circuit of the present invention.
Figure 6B:
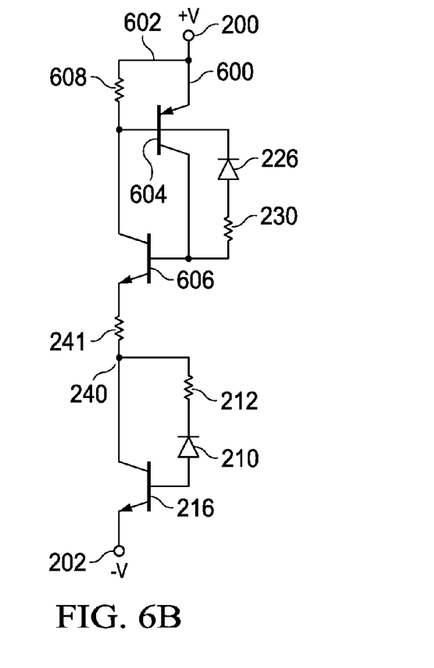

FIGS. 6A and 6B illustrate respective cross sectional and schematic diagrams of a fifth embodiment of an ESD protection circuit of the present invention. This embodiment is similar to the embodiment of FIG. 2A except that a semiconductor controlled rectifier (SCR) formed by PNP transistor 604 and NPN transistor 606 replaces NPN transistor 232. Also, N+ SNW contact 602 replaces N+ emitter 206 and P+ anode 600 is added. This embodiment of the present invention provides a holding voltage during an ESD event determined by the holding voltage of the SCR plus the snapback voltage of NPN transistor 216. This may be desirable for integrated circuits having a lower operating voltage and damage threshold. Moreover, this embodiment of the present invention may also be used in combination with previously discussed circuit elements.

In view of the foregoing explanation, it is important that the trigger or switching voltage of various embodiments of the ESD is less than the damage threshold (Vdam) of the protected circuit 242 (FIG. 2C). It is also important that the holding voltage of the ESD protection circuit is greater than the operating voltage of the protected circuit. This assures that application of an ESD pulse while power is applied to protected circuit 242 will not result in failure of the ESD protection circuit due to electrical overstress (EOS) from the power supply. Alternatively, in ESD protection applications for input, output, or input-output terminals, it may be desirable to design the ESD protection circuit with a lower holding or snapback voltage. As previously discussed, this may be accomplished by adjusting the trigger threshold of the ESD protection circuit.

Still further, while numerous examples have thus been provided, one skilled in the art should recognize that various modifications, substitutions, or alterations may be made to the described embodiments while still falling within the inventive scope as defined by the following claims. For example, the ESD protection circuit of FIG. 2A might be modified to use two series-connected SCRs, two series-connected diodes, or other suitable series-connected ESD devices as are known in the art. Moreover, it is to be understood that the present invention may discharge ESD current to Vss, Vdd, or other suitable terminals in response to the polarity and terminal combination of the ESD pulse. Other combinations will be readily apparent to one of ordinary skill in the art having access to the instant specification.

What is claimed is:

1. An electrostatic discharge (ESD) protection circuit, comprising:
    a substrate;
    an n-type buried layer formed below a surface of the substrate;
    a first terminal formed on the surface of the substrate;
    a second terminal formed on the surface of the substrate;
    a first ESD protection device having a first current path connecting between the first terminal and the n-type buried layer, the first ESD protection device including a first NPN bipolar transistor having a collector positioned in the n-type buried layer; and
    a second ESD protection device having a second current path connecting between the second terminal and the n-type buried layer, the second current path arranged in series with the first current path, the second ESD protection device including a second NPN bipolar transistor having an emitter positioned in the n-type buried layer,
    wherein the first NPN bipolar transistor has a first base that is electrically isolated from a second base of the second NPN transistor.

2. The ESD protection circuit of claim 1, wherein:
    the first ESD protection device includes a first diode having a first anode positioned in a first p-well and a first cathode coupled to the first terminal; and
    the second ESD protection device includes a second diode having a second anode positioned in a second p-well and a second cathode coupled to the buried layer.

3. A circuit as in claim 1, wherein one of the first and second ESD protection devices includes a diode.

4. A circuit as in claim 1, wherein one of the first and second ESD protection devices includes a semiconductor controlled rectifier (SCR).

5. A circuit as in claim 1, wherein one of the first and second ESD protection devices includes a diode and the other of the first and second ESD protection devices includes a semiconductor controlled rectifier (SCR).

6. The ESD protection circuit of claim 1, further comprising:
    an n-type well region positioned between the surface of the substrate and the n-type buried layer, and separating the first ESD protection device from the second ESD protection device.

7. The ESD protection circuit of claim 1, further comprising:
    a trench positioned between the surface of the substrate and the n-type buried layer, and separating the first ESD protection device from the second ESD protection device.

8. The ESD protection circuit of claim 1, further comprising:
    a first semiconductor region having a first conductivity type; and
    a first diode connected between the first terminal and the first semiconductor region, wherein a space between the first terminal and the first semiconductor region determines an avalanche threshold of the first diode.

9. The ESD protection circuit of claim 8, further comprising:
    a second semiconductor region having a second conductivity type opposite the first conductivity type; and
    a second diode connected between the second terminal and the second semiconductor region, wherein a space between the second terminal and the second semiconductor region determines an avalanche threshold of the second diode.

10. An integrated circuit, comprising:
    a substrate;
    an n-type buried layer formed below a surface of the substrate;

a first ESD protection device having a first current path connected to the buried layer, the first ESD protection device including a first NPN bipolar transistor having a collector positioned in the n-type buried layer; and a second ESD protection device having a second current path in series with the first current path, and the second current path connected to the buried layer, the second ESD protection device including a second NPN bipolar transistor having an emitter positioned in the n-type buried layer, wherein the first NPN bipolar transistor has a first base that is electrically isolated from a second base of the second NPN transistor.

11. The circuit as in claim 10, comprising:

a metal oxide semiconductor (MOS) transistor having an n-conductivity type source and drain implant; and wherein the first NPN bipolar transistor having an emitter in the n-conductivity type source and drain implant.

12. The circuit as in claim 11, comprising a p- conductivity type well in the substrate between the emitter of the first NPN bipolar transistor and the n-type buried layer, wherein the p-conductivity type well includes a body for the MOS transistor.

13. The circuit as in claim 11, comprising a n-conductivity type well formed in the substrate and electrically connected to the emitter of the first NPN bipolar transistor.

14. The circuit as in claim 10, wherein the first NPN bipolar transistor includes a first doping profile and the second NPN bipolar transistor includes a second doping profile different from the first doping profile.

15. An electrostatic discharge (ESD) protection circuit, comprising:

a substrate having a first conductivity type;

a buried layer having a second conductivity type formed below a surface of the substrate;

a first terminal formed on the surface of the substrate;

a second terminal formed on the surface of the substrate;

a first ESD protection device having a first current path connecting between the first terminal and the buried layer, the first ESD protection device includes a first NPN bipolar transistor having a collector positioned in the buried layer; and a second ESD protection device having a second current path connecting between the second terminal and the buried layer, the second current path arranged in series with the first current path, the second ESD protection device includes a second NPN bipolar transistor having an emitter positioned in the buried layer, wherein the first NPN bipolar transistor has a first base that is electrically isolated from a second base of the second NPN transistor.

16. An integrated circuit, comprising:

a substrate having a first conductivity type;

a buried layer having a second conductivity type formed below a surface of the substrate;

a first ESD protection device having a first current path connected to the buried layer, the first ESD protection device includes a first NPN bipolar transistor having a collector positioned in the buried layer; and a second ESD protection device having a second current path in series with the first current path, and the second current path connected to the buried layer, the second ESD protection device includes a second NPN bipolar transistor having an emitter positioned in the buried layer, wherein the first NPN bipolar transistor has a first base that is electrically isolated from a second base of the second NPN transistor.

* * * * *